US006998949B2

(12) United States Patent
Roozen et al.

(10) Patent No.: US 6,998,949 B2
(45) Date of Patent: Feb. 14, 2006

(54) MAGNETIC RESONANCE IMAGING (MRI) SYSTEM COMPRISING ACOUSTIC RESONATORS

(75) Inventors: Nicolaas Bernardus Roozen, Eindhoven (NL); Martijn Roger La Grange, Eindhoven (NL); Paul Royston Harvey, Eindhoven (NL); Patrick Willem Paul Limpens, Eindhoven (NL); Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 107 days.

(21) Appl. No.: 10/513,625

(22) PCT Filed: Apr. 11, 2003

(86) PCT No.: PCT/IB03/01494

§ 371 (c)(1),
(2), (4) Date: Nov. 4, 2004

(87) PCT Pub. No.: WO03/096029

PCT Pub. Date: Nov. 20, 2003

(65) Prior Publication Data

US 2005/0219026 A1    Oct. 6, 2005

(30) Foreign Application Priority Data

May 8, 2002    (EP)    .................................. 02076813

(51) Int. Cl.
*H01F 7/00*    (2006.01)
(52) U.S. Cl. ...................................... 335/301; 324/318
(58) Field of Classification Search ................ 335/216, 335/296–301; 324/318–322
See application file for complete search history.

(56) References Cited

U.S. PATENT DOCUMENTS 5,189,372 A    2/1993    Igarashi et al.

6,810,990 B1 *  11/2004    Dean et al. ................. 181/202

FOREIGN PATENT DOCUMENTS

| JP | 1-201247 | 8/1989 |
| WO | WO 92/15088 | 9/1992 |
| WO | WO 02/27346 A1 | 4/2002 |

* cited by examiner

Primary Examiner—Lincoln Donovan
(74) Attorney, Agent, or Firm—Thomas M. Lundin

(57) ABSTRACT

The invention relates to a magnetic resonance imaging (MRI) system (1) comprising an examination volume (11), a main magnet system (17) for generating a magnetic field (B0) in the examination volume, and a gradient magnet system (25) for generating altering gradients of the magnetic field in the examination volume. The gradient magnet system is accommodated in a housing (31) having a main wall (33) facing the examination volume and a substantially conical wall (35) facing away from the examination volume. The main wall and the conical wall enclose a substantially angular tip portion (47) of the housing. In order to limit the level of the acoustic vibrations in and around the MRI system (1) caused by mechanical vibrations of the angular tip portion (47), the MRI system comprises a plurality of acoustic resonators (55) which each comprise an elongate resonance volume (57) with an open end (59) and a closed end (61) and a length (L) between the open end and the closed end. The open ends of the resonators are arranged near the angular tip portion, and the length of the resonators is substantially equal to 0,25 k*(, wherein k=1, 3, 5, 7, . . . , and wherein (is the wavelength of an acoustic wave caused by mechanical vibrations of the angular tip portion. The resonators have the acoustic property of neutralizing acoustic waves having said wavelength (. Preferably, the length of the resonators is tuned to at least one of the wavelengths corresponding to the mechanical resonance frequencies of the vibrating angular tip portion, as the acoustic waves originating from the vibrations at these resonance frequencies constitute a main portion of the overall acoustic level of the MRI system.

9 Claims, 4 Drawing Sheets

MAGNETIC RESONANCE IMAGING (MRI) SYSTEM COMPRISING ACOUSTIC RESONATORS

Figure 1:
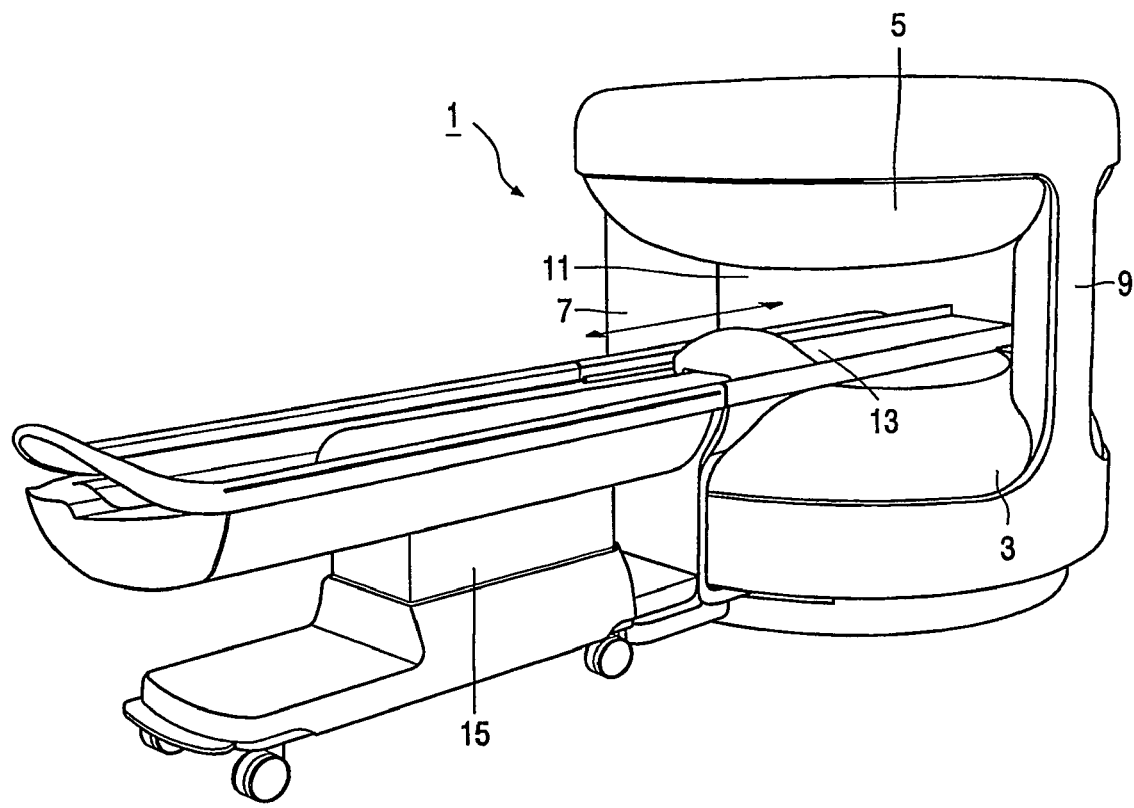

The invention relates to a magnetic resonance imaging (MRI) system comprising an examination volume, a main magnet system for generating a magnetic field in the examination volume, and a gradient magnet system for generating altering gradients of the magnetic field in the examination volume, the gradient magnet system being accommodated in at least one housing having a main wall facing the examination volume and a substantially conical wall facing away from the examination volume, said main wall and said conical wall enclosing a substantially angular tip portion of the housing.

An MRI system of the kind mentioned in the opening paragraph is known from WO-A-02/27346. The known MRI system is used to make images of the entrails of a patient's body by means of a nuclear magnetic resonance method. The known MRI system is of a so-called open type, wherein the examination volume is present between a lower system housing, which accommodates a first portion of the main magnet system and a first portion of the gradient magnet system, and an upper system housing, which accommodates a second portion of the main magnet system and a second portion of the gradient magnet system, and wherein the main magnet system generates a vertical magnetic field in the examination volume. The lower and the upper system housing are connected to each other only by means of a vertical post, so that the examination volume is easily accessible for the patient and for medical personal, and oppressive feelings of the patient in the examination volume, in particular if the patient suffers from claustrophobia, are considerably reduced.

The main magnet system of the known MRI system comprises a number of superconducting electric coils which are accommodated in a cryogenic container. Thus the magnetic field generated by the main magnet system in the examination volume is relatively strong, as a result of which strong nuclear magnetic resonance effects are achieved. The first and the second portion of the gradient magnet system each comprise a number of electric coils and are each accommodated in a housing having a substantially flat main wall facing the examination volume and a substantially conical wall facing away from the examination volume, i.e. facing the respective portion of the main magnet system. The conical portions of the gradient magnet system are accommodated in respective conical recesses formed in the respective portions of the main magnet system. As a result of the conical shape of the portions of the gradient magnet system, the overall dimensions of the main magnet system necessary to achieve a homogeneous magnetic field in the examination volume are reduced. An image of the patient's body is constructed by successively observing the nuclear magnetic resonance effects in a large number of positions in the patient's body, which are successively selected by altering the gradients of the magnetic field in three orthogonal directions. To limit the overall time necessary for a complete examination, the gradients are altered at relatively high frequencies, and accordingly the electric currents in the coils of the gradient magnet system are also altered at high frequencies.

A disadvantage of the known MRI system is that during operation relatively strong mechanical vibrations of the gradient magnet system occur. Said vibrations are caused by altering Lorentz forces acting on the coils of the gradient magnet system as a result of the electromagnetic interaction between the strong magnetic field of the main magnet system and the altering electric currents in said coils. Said mechanical vibrations lead to relatively strong acoustic vibrations in and around the MRI system, in particular also in the examination volume.

It is an object of the invention to provide a magnetic resonance imaging (MRI) system of the kind mentioned in the opening paragraph in which, during operation, acoustic vibrations in and around the MRI system are considerably limited in a relatively simple manner.

In order to achieve said object, a magnetic resonance imaging (MRI) system according to the invention is characterized in that the MRI system comprises a plurality of acoustic resonators which each comprise an elongate resonance volume with an open end and a closed end and a length between the open and the closed end, said open end being arranged near the angular tip portion, and said length being substantially equal to $k/4*\lambda$, wherein $k=1, 3, 5, 7, \ldots$, and $\lambda$ is the wavelength of an acoustic wave caused by mechanical vibrations of the angular tip portion. The invention is based on the recognition that during operation the strongest mechanical vibrations of the gradient magnet system occur at the location of the angular tip portion of the housing as a result of the relatively low mechanical rigidity of said tip portion. As a result, a relatively large portion of the acoustic vibrations of the MRI system originates from said angular tip portion and particularly occurs at a relatively small number of mechanical resonance frequencies of said angular tip portion. The acoustic resonators used in the MRI system according to the invention have a very simple structure. An acoustic property of said resonators is that an acoustic wave entering the resonance volume is reflected by the closed end, said reflected acoustic wave substantially neutralizing the entering acoustic wave if the entering acoustic wave has a wavelength equal to $4*L/k$, wherein L is the length of the resonance volume, and $k=1, 3, 5, 7, \ldots$. As a result, said resonators have the property of substantially neutralizing acoustic waves of a number of specific wavelengths dependent on the length of the resonance volume. Since in the MRI system according to the invention the open ends of the resonators are arranged near the angular tip portion, the acoustic waves originating from said tip portion will enter the resonance volumes of the resonators. By tuning the length of the resonance volumes to one or to a number of said mechanical resonance frequencies of the angular tip portion, the acoustic waves originating from the angular tip portion at said resonance frequencies are substantially neutralized, so that a relatively large portion of the acoustic vibrations of the MRI system is effectively neutralized and the acoustic vibrations in and around the MRI system are considerably limited by means of relatively simple measures.

A particular embodiment of an MRI system according to the invention is characterized in that the open ends are arranged at a distance from the angular tip portion which is smaller than approximately $0,2*\lambda$. If the distance between the open ends of the acoustic resonators and the angular tip portion is smaller than approximately $0,2*\lambda$, it appears that the acoustic resonators are particularly effective.

A particular embodiment of an MRI system according to the invention is characterized in that the open ends face the angular tip portion. If the open ends of the acoustic resonators face the angular tip portion, the distance between the open ends and the angular tip portion is further reduced, so that the effectiveness of the acoustic resonators is further improved.

A particular embodiment of an MRI system according to the invention is characterized in that the resonators are arranged at regular mutual distances along an imaginary circle which is concentric with respect to the angular tip portion. By using said plurality of resonators, which are regularly arranged along said imaginary circle, the acoustic vibrations originating from the angular tip portion are regularly distributed over said plurality of resonators, so that said acoustic vibrations are homogeneously neutralized by the resonators, seen in a circumferential direction of the angular tip portion.

A particular embodiment of an MRI system according to the invention is characterized in that the resonance volume of at least one of the resonators is circular cylindrical. In this further embodiment, said resonator has a particularly simple structure and can be formed, for example, as a simple tube having an open end at one end portion and a closed end at the other end portion, or as a simple circular cylindrical bore in a piece of material.

A particular embodiment of an MRI system according to the invention is characterized in that the resonance volume of at least one of the resonators comprises a first cylindrical portion adjoining the open end and having a first cross-sectional area, and a second cylindrical portion adjoining the closed end and having a second cross-sectional area smaller than said first cross-sectional area. In this still further embodiment, said resonator is tuned to two different frequencies or wave-lengths, i.e. a first wave-length dependent on the length of the first cylindrical portion and a second wave-length dependent on the length of the total resonance volume, i.e. the length of the first and the second cylindrical portion together in embodiments wherein said two portions adjoin each other. In this manner, the total number of resonators necessary to neutralize the acoustic waves at all main resonance frequencies of the angular tip portion is considerably reduced, so that the MRI system is further simplified. It is noted that the expression "cylindrical" is not restricted to "circular cylindrical", but merely means that each portion of the resonance volume has a substantially constant cross-section, which can for example also be square.

A particular embodiment of an ME system according to the invention is characterized in that the resonators are accommodated in a conical gap which is present between the conical wall of the housing of the gradient magnet system and a further conical wall of a housing of the main magnet system, the resonators extending in substantially radial directions with respect to a central axis of the gradient magnet system. In this manner, the resonators are accommodated in the MRI system in a very practical and effective way, and the open ends of the resonators can be arranged very close to the angular tip portion. The resonators are, for example, mounted to said further conical wall of the housing of the main magnet system, but the resonators can also be mounted to the conical wall of the housing of the gradient magnet system.

A particular embodiment of an MRI system according to the invention is characterized in that the resonators are accommodated in a gap which is present between the main wall of the housing of the gradient magnet system and a plate-shaped carrier, which is present between the gradient magnet system and the examination volume and carries an RF-oil of the MRI system, the resonators extending in substantially radial directions with respect to a central axis of the gradient magnet system. Also in this embodiment, the resonators are accommodated in the MRI system in a very practical and effective way. The resonators are, for example, mounted to the plate-shaped carrier, but the resonators can also be mounted to the main wall of the housing of the gradient magnet system.

A further embodiment of an MRI system according to the invention is characterized in that the resonance volume of each resonator comprises a first portion, which adjoins the closed end and extends in a substantially radial direction with respect to the central axis, and a second portion, which adjoins the open end and is bent relative to the first portion in a direction towards the angular tip portion. In this manner, the open ends of the acoustic resonators face the angular tip portion, so that the distance between the open ends and the angular tip portion is reduced and the effectiveness of the resonators is considerably improved. Since a major portion of the resonance volume extends in the radial direction, the height of the gap, which accommodates the resonators and is present between the main wall of the housing of the gradient magnet system and the plate-shaped carrier of the RF-coil, is limited. In this manner, the dimensions of the examination volume adjoining the plate-shaped carrier are hardly affected by the presence of the resonators.

Figure 2:
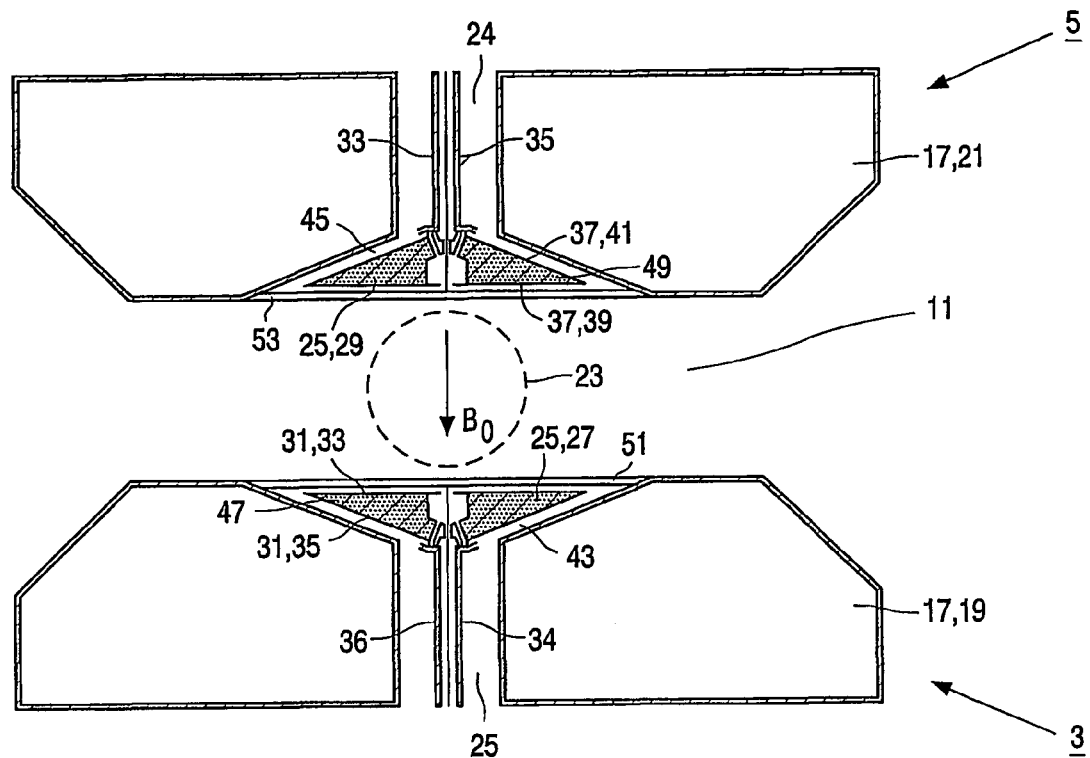
Figure 3:
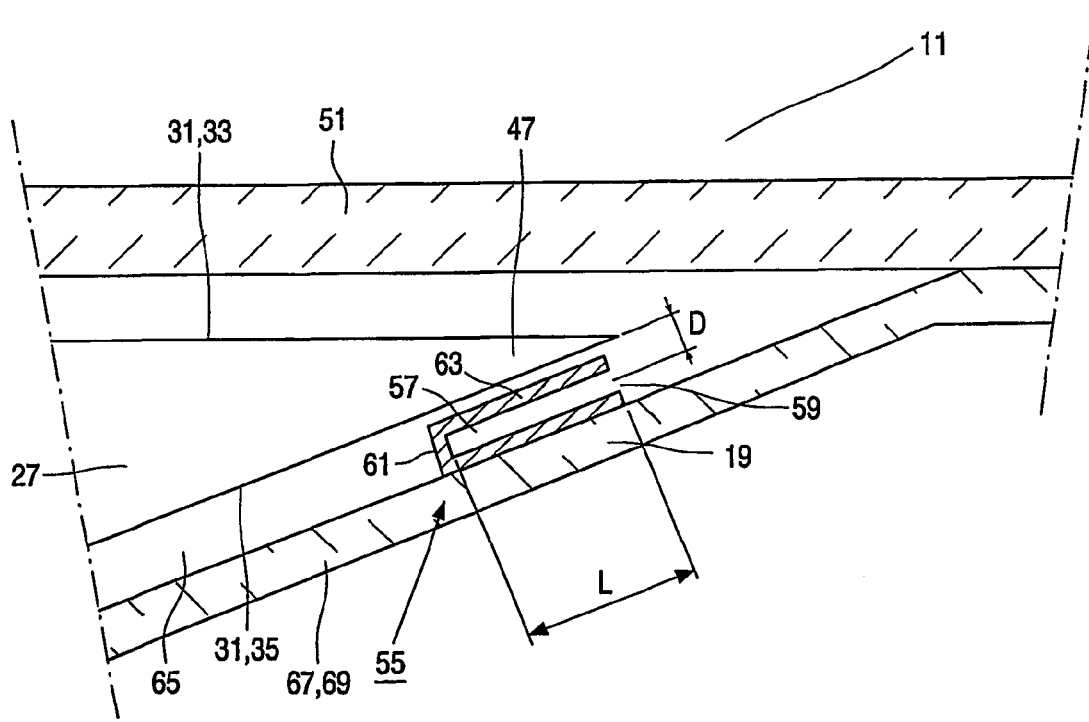
Figure 4:
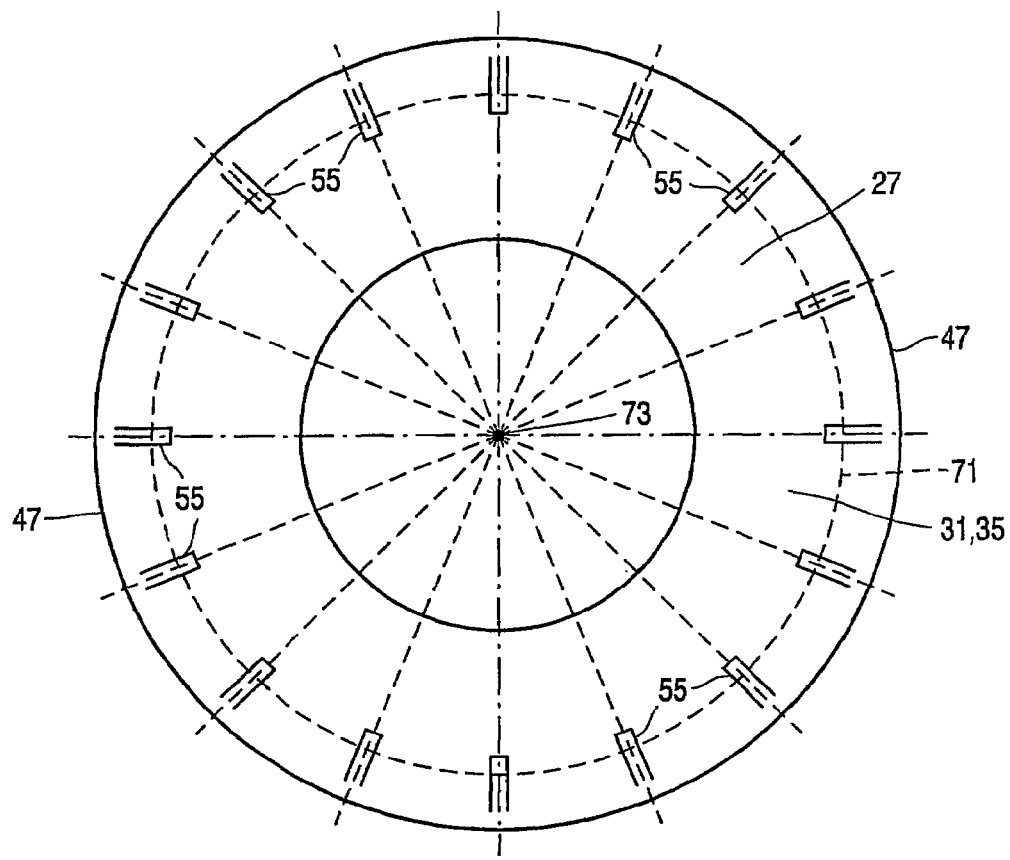
Figure 5:
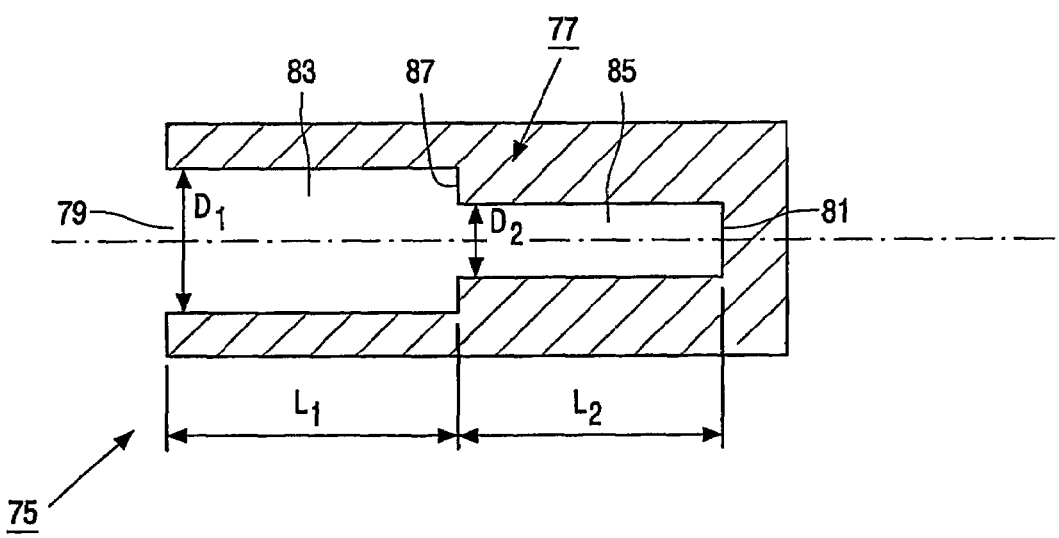
Figure 6:
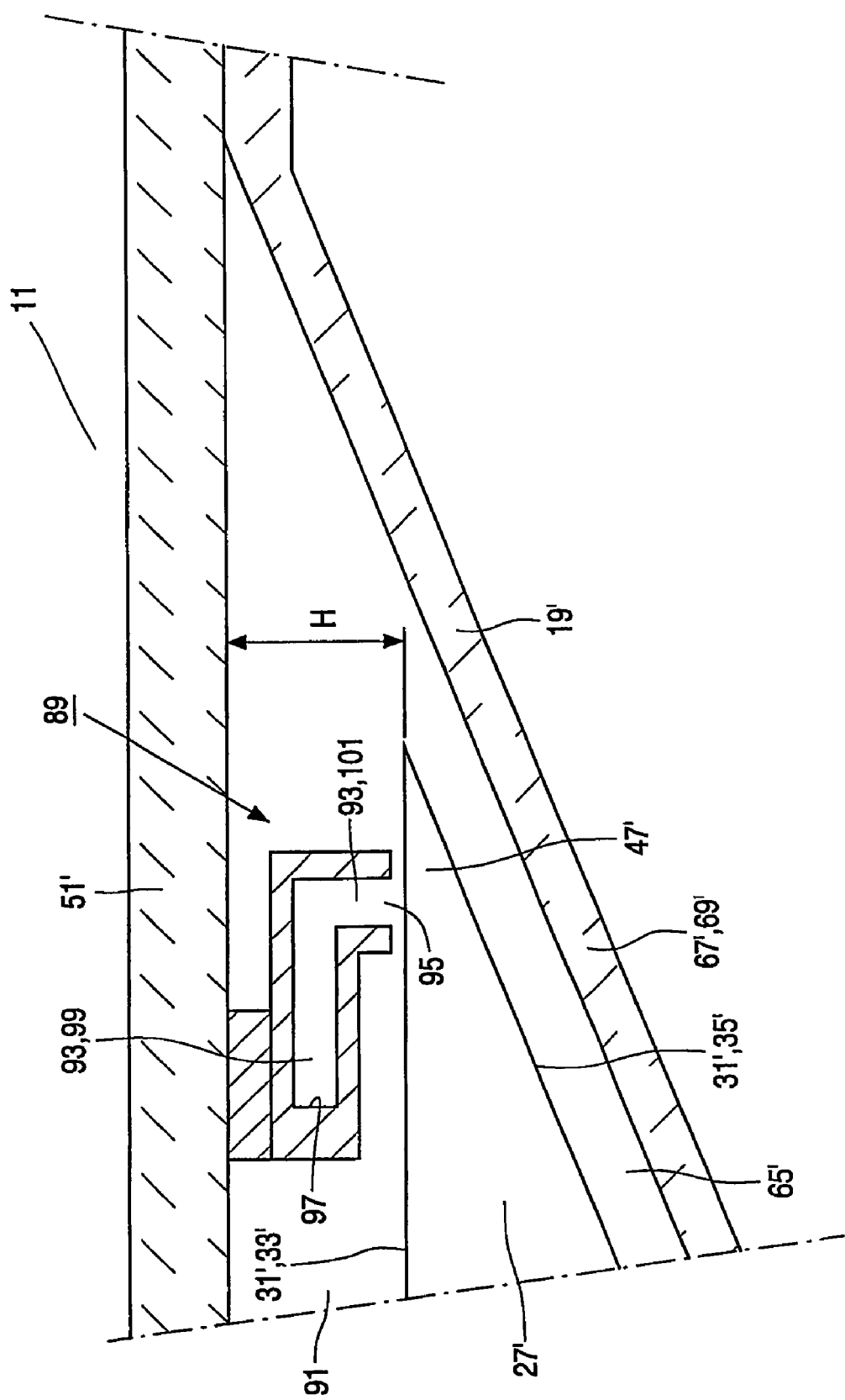

In the following, embodiments of a magnetic resonance imaging (MRI) system according to the invention will be described in detail with reference to the drawings in which:

FIG. 1 shows a first embodiment of an MRI system according to the invention,

FIG. 2 schematically shows a cross section of a lower system housing and an upper system housing of the MRI system of FIG. 1, FIG. 3 schematically shows a cross section of the neighbourhood of an angular tip portion of a housing of a gradient magnet system of the MRI system of FIG. 1, FIG. 4 schematically shows the positions of a plurality of acoustic resonators in the MRI system of FIG. 1, FIG. 5 schematically shows an alternative acoustic resonator which may be used in the MRI system of FIG. 1, and FIG. 6 schematically shows a cross section of the neighbourhood of an angular tip portion of a housing of a gradient magnet system of a second embodiment of an MRI system according to the invention.

The first embodiment of a magnetic resonance imaging (MRI) system 1 according to the invention as shown in FIG. 1 is an MRI system of the so-called open type comprising a lower system housing 3 and an upper system housing 5 which are mutually connected by means of two vertical posts 7 and 9. Between the lower system housing 3 and the upper system housing 5 an examination volume 11 is present in which a patient to be examined can be placed. For this purpose, the MRI system 1 comprises a horizontal patient bed 13 which can be moved into the examination volume 11 from a trolley 15, which can be coupled to the lower system housing 3. As a result of the open structure of the MRI system 1 as described before, the examination volume 11 is easily accessible for the patient and for the medical personnel. Furthermore, oppressive feelings of the patient in the examination volume 11, which the patient may have particularly if the patient suffers from claustrophobia, are considerably reduced as a result of said open structure.

The MRI system 1 is used to generate images of the entrails of the patient's body by means of a nuclear magnetic resonance method. For this purpose, as shown in FIG. 2, the MRI system 1 comprises a main magnet system 17 comprising a first portion 19 accommodated in the lower system housing 3 and a second portion 21 accommodated in the upper system housing 5. The main magnet system 17 comprises a number of superconducting electric coils, not shown in the Figures, for generating a substantially homogeneous vertical magnetic field $B_0$ in a central portion 23 of the examination volume 11. The superconducting coils are accommodated in cryogenic containers which are also accommodated in the lower system housing 3 and in the upper system housing 5. The MRI system 1 further comprises a gradient magnet system 25 comprising a first portion 27 accommodated in the lower system housing 3 and a second portion 29 accommodated in the upper system housing 5. The gradient magnet system 25 comprises a number of electric coils, also not shown in the Figures, which are used to generate altering gradients of the magnetic field $B_0$ in the examination volume 11. As a result of the use of said superconducting coils, the magnetic field $B_0$ is relatively strong, so that strong nuclear magnetic resonance effects are achieved.

An image of the patient's body is constructed by successively observing the nuclear magnetic resonance effects in a large number of positions in the patient's body, which are successively selected by altering the gradients of the magnetic field $B_0$ in three orthogonal directions.

The electric coils of the gradient magnet system 25 are partially arranged in a conical configuration. As a result the overall dimensions, which the superconducting coils of the main magnet system 17 should have in order to achieve that the dimensions of the homogeneous portion 23 of the magnetic field $B_0$ are sufficiently large, are reduced. For a detailed explanation of said conical configuration and of the effects thereof reference is made to WO-A-02/27346. As a consequence, as shown in FIG. 2, the first portion 27 and the second portion 29 of the gradient magnet system 25 are accommodated respectively in a first housing 31, which has a substantially flat main wall 33 facing the examination volume 11 and a substantially conical wall 35 facing away from the examination volume 11, and in a second housing 37, which has a substantially flat main wall 39 facing the examination volume 11 and a substantially conical wall 41 facing away from the examination volume 11. The first housing 31 and the second housing 37 of the gradient magnet system 25 are accommodated in respectively a conical recess 43, provided in the first portion 19 of the main magnet system 17, and in a conical recess 45 provided in the second portion 21 of the main magnet system 17. Said main walls 33, 39 and said conical walls 35, 41 enclose substantially angular tip portions 47 and 49 of the first housing 31 and of the second housing 37, respectively. As further shown in FIG. 2, a first plate-shaped carrier 51 is arranged between the first portion 27 of the gradient magnet system 25 and the examination volume 11, and a second plate-shaped carrier 53 is arranged between the second portion 29 of the gradient magnet system 25 and the examination volume 11. The plate-shaped carriers 51 and 53 each carry a number of RF-coils, not shown in the Figures, which generate RF-signals to induce the nuclear magnetic resonance effects in the patient's body and which receive RF-signals generated by the patient's body as a result of said nuclear magnetic resonance effects.

To limit the overall time necessary for a complete examination, the gradients of the magnetic field $B_0$ are altered at relatively high frequencies, and accordingly the electric currents in the coils of the gradient magnet system 25 are also altered at high frequencies. As a result of the electromagnetic interaction between the strong magnetic field of the main magnet system 17 and the altering currents in the coils of the gradient magnet system 25, altering Lorentz forces are exerted on the coils of the gradient magnet system 25, which cause mechanical vibrations of the first portion 27 and of the second portion 29 of the gradient magnet system 25. As a result of the high frequencies at which the electrical currents in the coils of the gradient magnet system 25 are altered, the mechanical vibrations lead to acoustic vibrations in and around the MRI system 1, in particular also in the examination volume 11.

In order to limit the level of said acoustic vibrations and particularly to prevent acoustic vibrations which are inconvenient for persons in the neighbourhood of the MRI system 1 and for the patient in the examination volume 11, the MRI system 1 according to the invention comprises a plurality of acoustic resonators 55, one of which resonators 55 is schematically shown in FIG. 3. It is noted that FIG. 3 and the following description relate to a plurality of acoustic resonators 55 provided in the lower system housing 3, and that a similar set of acoustic resonators is provided in a similar manner in the upper system housing 5. The resonators 55 each comprise an elongate resonance volume 57 with an open end 59 and a closed end 61. Between the open end 59 and the closed end 61 a length L of the resonance volume 57 is present. In the embodiment shown in FIG. 3, the resonators 55 are each formed by a simple tube 63, with the open end 59 being present at one end portion of the tube 63 and the closed end 61 being present at the other end portion of the tube 63. Thus the resonance volume 57 of the resonator 55 is circular cylindrical. It is noted that the resonators 55 can also be formed in a different way, for example as a simple circular cylindrical bore in a piece of material. It is further noted that the resonators 55 can also have another cross-section, for example a square cross-section.

In the embodiment shown in FIG. 3 the resonators 55 are accommodated in a conical gap 65 which is present between the conical wall 35 of the first housing 31 of the gradient magnet system 25 and a further conical wall 67 of a housing 69 of the first portion 19 of the main magnet system 17, the resonators 55 being mounted to said further conical wall 67. Alternatively, the resonators 55 may also be mounted to the conical wall 35. As schematically shown in FIG. 4, the resonators 55 are arranged at regular mutual distances along an imaginary circle 71 which is concentric with respect to the angular tip portion 47, the resonance volumes 57 of the resonators extending in substantially radial directions with respect to a central axis 73 of the gradient magnet system 25.

The invention is based on the recognition that during operation the mechanical vibrations of the gradient magnet system 25 are strongest at the locations of the angular tip portions 47 and 49 of the first housing 31 and the second housing 37 of the gradient magnet system 25, because at these locations the first housing 31 and the second housing 37 and also the respective portions 27 and 29 of the gradient magnet system 25 accommodated therein have a relatively low mechanical rigidity. As a result, a relatively large portion of the acoustic vibrations caused by the entire MRI system 1 originates from the angular tip portions 47 and 49. Particularly, a relatively large portion of the acoustic vibrations originating from the angular tip portions 47 and 49 occurs at a relatively small number of mechanical resonance frequencies of the angular tip portions 47 and 49. The acoustic resonators 55 used in the MRI system 1 according to the invention are particularly suitable to limit the propagation of the acoustic vibrations occuring at at least one of said mechanical resonance frequencies of the angular tip portions 47 and 49. For this purpose, as shown in FIG. 3, the open ends 59 of the resonators 55 are arranged near the angular tip portion 47, and the length L of the resonance volume 57 of each resonator 55 is substantially equal to $\lambda*k/4$, wherein $k=1, 3, 5, 7, \ldots$, and wherein $\lambda$ is the wavelength of an acoustic wave propagating at one of said mechanical resonance frequencies. An acoustic property of the resonators 55 is that an acoustic wave entering the resonance volume 57 via the open end 59 is reflected by the closed end 61. If said acoustic wave has a wavelength $\lambda$ equal to $4*L/k$, the reflected acoustic wave has a phase opposite to a phase of the entering acoustic wave, so that the reflected acoustic wave substantially neutralizes the entering acoustic wave. Since in the MRI system 1 the open ends 59 of the acoustic resonators 55 are arranged near the angular tip portion 47, the acoustic waves originating from the angular tip portion 47 will enter the resonance volumes 57 of the resonators 55 via the open ends 59. Since the length L of the resonators is tuned to the wavelength $\lambda$ of the acoustic waves propagating at one of the mechanical resonance frequencies of the angular tip portion 47, said acoustic waves are substantially neutralized by the resonators 55. As said acoustic waves constitute a relatively large portion of the total acoustic vibrations caused by the entire MRI system 1, the total level of the acoustic vibrations of the MRI system 1 is considerably reduced by relatively simple structural means. As the resonators 55 are arranged at regular mutual distances along the imaginary circle 71, as shown in FIG. 4, the acoustic vibrations originating from the angular tip portion 47 are regularly distributed over the plurality of resonators 55, so that said acoustic waves are homogeneously neutralized by the resonators 55, seen in a circumferential direction of the angular tip portion 47.

As mentioned before, the open ends 59 of the resonators 55 should be arranged near the angular tip portion 47 in order to be effective. In the embodiment shown in FIG. 3, a distance D of approximately $0.05*\lambda$ is present between the open end 59 and the angular tip portion 47. It is noted that the invention also covers embodiments in which another distance is present between the open ends of the resonators and the angular tip portion. It is noted however that, in order to allow the resonators 55 to be effective, said distance should not exceed a value of approximately $0.2*\lambda$, $\lambda$ being the wavelength of the acoustic waves which are to be neutralized by means of the resonators 55.

It is further noted that the invention is not limited as regards the number and the mutual arrangement of the acoustic resonators 55 to be used. In the embodiment of FIG. 4, 16 resonators 55 are arranged at regular mutual distances around the central axis 73, but another number of resonators 55 may also be used. As regards the mutual arrangement of the resonators 55, it is noted that the resonators 55 may for example also be arranged in groups. Such an embodiment is particularly advantageous if the resonators are formed as cylindrical bores in a piece of material. In such a case, a number of such bores may be applied in such a piece of material, and a plurality of such pieces of material may be arranged around the central axis 73.

In the embodiment shown in FIG. 3 and FIG. 4, the resonance volumes 57 of the resonators 55 each have a length L of approximately 0.16 m corresponding to $0.25*\lambda$, wherein $\lambda$ is approximately 0.65 m corresponding to a frequency of approximately 475 Hz. It is noted that in FIG. 3 and FIG. 4 the resonators 55 are not drawn to scale. However, the invention is not limited to embodiments in which resonators having identical lengths are used. An MRI system according to the invention may for example comprise a first plurality of resonators having a first length $L_1$ and a second plurality of resonators having a second length $L_2$, or may even comprise resonators of more than two different lengths. In this manner, acoustic waves propagating at two or more than two different mechanical resonance frequencies of the angular tip portion are neutralized. It is further noted that the invention is not limited to embodiments in which the length of the resonators is tuned to the wavelength of acoustic waves propagating at one or more than one of the mechanical resonance frequencies of the angular tip portion. The length of the resonators may also be tuned to a wavelength of acoustic waves propagating at a frequency which is not a mechanical resonance frequency of the angular tip portion.

FIG. 5 schematically shows an alternative resonator 75 which may be used in the MRI system 1 instead of the resonator 55 described before. The alternative resonator 75 has a resonance volume 77 comprising an open end 79 and a closed end 81. The resonance volume 77 comprises a first circular cylindrical portion 83, which adjoins the open end 79 and has a length $L_1$ and a diameter $D_1$, and a second circular cylindrical portion 85, which adjoins the closed end 81 and has a length $L_2$ and a second diameter $D_2$ which is smaller than the first diameter $D_1$. The first portion 83 and the second portion 85 are mutually connected at the location of a step 87. The alternative resonator 75 has the acoustic property of being tuned to acoustic waves having two different wavelengths, i.e. a first group of wavelengths $\lambda_1 = 4*L_1/k$ and a second group of wavelengths $\lambda_{2=4}*(L_1+L_2)/k$, wherein $k=1, 3, 5, 7, \ldots$. In this manner, the total number of resonators 75 necessary to neutralize acoustic waves propagating at a given number of mechanical resonance frequencies or other vibrational frequencies of the angular tip portion 47 is considerably reduced, so that the MRI system 1 is further simplified. It is noted that the most practical manner of manufacturing the alternative resonators 75 is to provide suitable bores in a piece of material. It is further noted that the resonance volumes 77 of the resonators 75 may also comprise more than two portions having different diameters and/or lengths, so that the resonators 75 can be tuned to more than two different wavelengths or groups of wavelengths. Resonators may, for example, be used having a primary cylindrical portion adjoining the open end and having a first relatively large cross-sectional area and two or more parallel secondary cylindrical portions in line with said primary portion and having different lengths and/or different cross-sectional areas.

FIG. 6 schematically shows an angular tip portion 47' of a housing 31' which accommodates a first portion 27' of a gradient magnet system of a second embodiment of an MRI system according to the invention. In FIG. 6 parts of the second embodiment of the MRI system, which correspond with parts of the MRI system 1 as described before, are indicated by means of corresponding reference numbers. In the following only the main differences between the second embodiment and the first embodiment, i.e. the MRI system 1, will be discussed.

The second embodiment of the MRI system according to the invention mainly differs from the MRI system 1 in that in the second embodiment a plurality of acoustic resonators 89 is accommodated in a gap 91 which is present between the main wall 33' of the housing 31' of the gradient magnet system and the plate-shaped carrier 51' carrying the RF-coils. In the embodiment shown the resonators 89 are mounted to the plate-shaped carrier 51', but alternatively the resonators 89 may also be mounted to the main wall 33'. Like the MRI system 1, the resonators 89 are arranged at regular mutual distances along an imaginary circle around the central axis of the gradient magnet system. The resonators 89 each comprise a resonance volume 93 having an open end 95 and a closed end 97. As shown in FIG. 6 the resonance volume 93 comprises a circular cylindrical first portion 99, which adjoins the closed end 97 and extends in a substantially radial direction with respect to the central axis, and a circular cylindrical second portion 101, which adjoins the open end 95. The second portion 101 is bent relative to the first portion 99 in a direction towards the angular tip portion 47', so that the open end 95 of the resonator 89 faces the angular tip portion 47'. As the open end 95 of the resonator 89 faces the angular tip portion 47', the distance between the open end 95 and the angular tip portion 47' is reduced, as a result of which the effectiveness of the resonator 89 is improved. As the first portion 99, which is a major portion of the resonance volume 93, extends in a radial direction with respect to the central axis, a height H of the gap 91 necessary to accommodate the resonator 89, is limited, so that the dimensions of the examination volume 11 adjoining the plate-shaped carrier 51' are hardly affected by the presence of the resonators 89. It is noted that the height H of the gap 91 can be further reduced in an alternative embodiment, in which the resonators 89 are integrated into the plate-shaped carrier 51'. In such an alternative embodiment, the resonators 89 are provided in the plate-shaped carrier 51' by providing the carrier 51' with suitable recesses for accommodating the resonators 89 or by providing the carrier 51' with suitable bores which as such constitute the resonators. It is further noted that, instead of the resonators 89 in FIG. 6, resonators may be used which are substantially identical to the resonators 55 in the embodiment of FIG. 3 and which, accordingly, completely extend in radial directions.

What is claimed is:

1. A magnetic resonance imaging (MRI) system comprising an examination volume, a main magnet system for generating a magnetic field in the examination volume, and a gradient magnet system for generating altering gradients of the magnetic field in the examination volume, the gradient magnet system being accommodated in at least one housing having a main wall facing the examination volume and a substantially conical wall facing away from the examination volume, said main wall and said conical wall enclosing a substantially angular tip portion of the housing, characterized in that the MRI system comprises a plurality of acoustic resonators which each comprise an elongate resonance volume with an open end and a closed end and a length between the open and the closed end, said open end being arranged near the angular tip portion, and said length being substantially equal to k/4*λ, wherein k=1, 3, 5, 7, . . . , and λ is the wavelength of an acoustic wave caused by mechanical vibrations of the angular tip portion.

2. An MRI system as claimed in claim 1, wherein the open ends are arranged at a distance from the angular tip portion which is smaller than approximately 0,2*λ.

3. An MRI system as claimed in claim 1, wherein the open ends face the angular tip portion.

4. An MRI system as claimed in claim 1, wherein the resonators are arranged at regular mutual distances along an imaginary circle which is concentric with respect to the angular tip portion.

5. An MRI system as claimed in claim 1, wherein the resonance volume of at least one of the resonators is circular cylindrical.

6. An MRI system as claimed in claim 1, wherein the resonance volume of at least one of the resonators comprises a first cylindrical portion adjoining the open end and having a first cross-sectional area, and a second cylindrical portion adjoining the closed end and having a second cross-sectional area smaller than said first cross-sectional area.

7. An MRI system as claimed in claim 1, wherein the resonators are accommodated in a conical gap which is present between the conical wall of the housing of the gradient magnet system and a further conical wall of a housing of the main magnet system, the resonators extending in substantially radial directions with respect to a central axis of the gradient magnet system.

8. An MRI system as claimed in claim 1, wherein the resonators are accommodated in a gap which is present between the main wall of the housing of the gradient magnet system and a plate-shaped carrier, which is present between the gradient magnet system and the examination volume and carries an RF-coil of the MRI system, the resonators extending in substantially radial directions with respect to a central axis of the gradient magnet system.

9. An MRI system as claimed in claim 8, wherein the resonance volume of each resonator comprises a first portion, which adjoins the closed end and extends in a substantially radial direction with respect to the central axis, and a second portion, which adjoins the open end and is bent relative to the first portion in a direction towards the angular tip portion.

* * * * *